United States Patent
Wang

(10) Patent No.: US 9,768,407 B2
(45) Date of Patent: Sep. 19, 2017

(54) SUBSTRATE-SEALING METHOD, FRIT AND ELECTRONIC DEVICE

(71) Applicant: BOE TECHNOLOGY GROUP CO., LTD., Beijing (CN)

(72) Inventor: Dan Wang, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 14/437,095

(22) PCT Filed: Sep. 19, 2014

(86) PCT No.: PCT/CN2014/086893
§ 371 (c)(1),
(2) Date: Apr. 20, 2015

(87) PCT Pub. No.: WO2015/149485
PCT Pub. Date: Oct. 8, 2015

(65) Prior Publication Data
US 2016/0293881 A1    Oct. 6, 2016

(30) Foreign Application Priority Data

Apr. 4, 2014 (CN) .......................... 2014 1 0137145

(51) Int. Cl.
*H01L 51/00* (2006.01)
*H01L 51/52* (2006.01)
*H01L 51/56* (2006.01)
*H01L 51/44* (2006.01)

(52) U.S. Cl.
CPC ...... *H01L 51/5246* (2013.01); *H01L 51/0024* (2013.01); *H01L 51/448* (2013.01);
(Continued)

(58) Field of Classification Search
CPC .......... H01L 51/00; H01L 51/52; H01L 51/56
(Continued)

(56) References Cited

U.S. PATENT DOCUMENTS

| 8,287,995 B2 | 10/2012 | Shibuya et al. |
| 8,597,557 B1* | 12/2013 | Torkelson et al. ........ 264/211.21 |
| 2009/0269573 A1* | 10/2009 | Omori et al. .................. 428/323 |

(Continued)

FOREIGN PATENT DOCUMENTS

| CN | 101009300 A | 8/2007 |
| CN | 101009302 A | 8/2007 |

(Continued)

OTHER PUBLICATIONS

Office Action in Chinese Patent Application No. 201410137145.6, dated Sep. 29, 2015.
(Continued)

*Primary Examiner* — Sheng Zhu
(74) *Attorney, Agent, or Firm* — Brooks Kushman P.C.

(57) ABSTRACT

The present disclosure provides a substrate-sealing method, frit and an electron device, and relates to the field of sensitive electronic components sealing technology. The method includes: coating glass cement on a first glass substrate within a sealing area, the glass cement including carbon nanotubes; pressing the first glass substrate and a second glass substrate together, and melting and sintering the glass cement between the first glass substrate and the second glass substrate at the sealing area by irradiating the sealing area with a laser.

8 Claims, 2 Drawing Sheets

(52) U.S. Cl.
CPC .......... *H01L 51/56* (2013.01); *H01L 51/0048* (2013.01); *H01L 2251/303* (2013.01); *Y02E 10/549* (2013.01)

(58) Field of Classification Search
USPC .................................. 428/34, 323, 325, 329
See application file for complete search history.

(56) References Cited

U.S. PATENT DOCUMENTS

| | | |
|---|---|---|
| 2010/0044730 A1 | 2/2010 | Kwon et al. |
| 2011/0223360 A1* | 9/2011 | Shibuya et al. ................. 428/34 |
| 2012/0261620 A1* | 10/2012 | Richter .................. B82Y 30/00 252/500 |
| 2014/0124186 A1* | 5/2014 | Suwa et al. ................... 165/185 |

FOREIGN PATENT DOCUMENTS

| | | |
|---|---|---|
| CN | 101454860 A | 6/2009 |
| CN | 101526272 A | 9/2009 |
| CN | 102005443 A | 4/2011 |
| CN | 102331642 A | 1/2012 |
| CN | 102822109 A | 12/2012 |
| CN | 103928638 A | 7/2014 |

OTHER PUBLICATIONS

International Search Report and Written Opinion in PCT International Application No. PCT/CN2014/086893, dated Jan. 6, 2015.
Office Action in Chinese Patent Application No. 201410137145.6, dated May 10, 2016.

\* cited by examiner

SUBSTRATE-SEALING METHOD, FRIT AND ELECTRONIC DEVICE

CROSS-REFERENCE TO RELATED APPLICATIONS

The present application is the U.S. National Phase of International Patent Application No. PCT/CN2014/086893, filed on Sep. 19, 2014 which claims a priority to Chinese Patent Application No. 201410137145.6 filed on Apr. 4, 2014, the disclosure of which is incorporated in its entirety by reference herein.

TECHNICAL FIELD

The present disclosure relates to the field of sensitive electronic components sealing technology, in particular to a substrate-sealing method, frit and an electronic device.

BACKGROUND

In recent years, an organic light emitting diode (OLED) display has gradually been paid more and more attention as a new type of flat panel display. Since it has characteristics of active luminescence, high luminous intensity, high resolution, wide visual angle, rapid response speed, low energy consumption and flexibility, the OLED display possibly becomes the Next-Generation display and replaces a liquid crystal display. For an OLED device, both an organic layer material and a metal electrode material therein are extremely sensitive to the moisture and oxygen, as a result if the OLED device is badly sealed, its product life will be greatly shortened. So the moisture and the oxygen are of a relative low content acceptable for the OLED device, which are $10^{-6}$ g/day/m$^2$ and $10^{-3}$ cm$^3$/day/m$^2$, respectively. To meet such requirement, technologies for sealing the OLED device have been developed rapidly, which includes: film sealing, frit sealing, ultraviolet (UV) glue sealing, and dam and fill sealing.

In the related art, as compared with other sealing methods, the fit sealing method has been widely applied to seal medium and small size OLED devices, due to its significant advantages. By means of the frit sealing method, the frit is melted by heating with a movable laser beam in a nitrogen atmosphere, then the molten frit forms a hermetic sealing connection between upper glass substrate and lower glass substrate, thereby to provide a hermetic seal. Most currently used frit includes inorganic oxide sealing glass being as a basic material. The basic material is improved in dispersity by adding a dispersant, a filler, an organic solvent or the like; and it is improved in absorption to light by adding with elements such as Cu, Fe.

The existing fit sealing method has the following disadvantage: as the frit is of limited absorption to light, a laser having relative high power is desired. The risk of occurrence of a crack in the glass substrate will greatly increase when the laser having relative high power is used to irradiate.

SUMMARY

An object of the present disclosure is to provide a substrate-sealing method, so as to promote the glass cement to absorb more laser energy, and decrease the laser power desired for the sealing process, thereby to avoid a crack from occurring in the glass substrate.

In one aspect, the present disclosure provides in embodiments a substrate-sealing method, including steps of:

coating glass cement on a first glass substrate within a sealing area, the glass cement including carbon nanotubes;

pressing the first glass substrate and a second glass substrate together; and melting and sintering the glass cement between the first glass substrate and the second glass substrate at the sealing area by irradiating the sealing area with a laser.

Alternatively, the glass cement is formed by the following steps:

mixing sealing glass and the carbon nanotubes to obtain frit; and dispersing the frit into a carrier to obtain the glass cement.

Alternatively, the carbon nanotubes include:

first carbon nanotubes having a degradation temperature lower than a predetermined temperature; and/or second carbon nanotubes having a degradation temperature higher than the predetermined temperature.

Alternatively, when the carbon nanotubes include the first carbon nanotubes, the first carbon nanotubes have a mass percentage of 5% or less in the frit; and when the carbon nanotubes include the second carbon nanotubes, the second carbon nanotubes have a mass percentage between 0.1% and 10% in frit.

Alternatively, prior to the step of pressing the first glass substrate and the second glass substrate together, the method further includes preheating the glass cement coated within the sealing area, so as to remove a solvent and an organic component from the glass cement.

Alternatively, the predetermined temperature is a preheating temperature at which the glass cement is preheated.

Alternatively, when the carbon nanotubes include the second carbon nanotubes and the glass cement coated within the sealing area is irradiated by the laser, and transmitting power of the laser is controlled to enable the sealing area to be at a temperature lower than the degradation temperature of the second carbon nanotubes.

In another aspect, the present disclosure further provides in embodiments frit including sealing glass and a filler, wherein the filler includes carbon nanotubes.

Alternatively, the carbon nanotubes include:

first carbon nanotubes having a degradation temperature lower than a predetermined temperature; and/or second carbon nanotubes having a degradation temperature higher than the predetermined temperature.

Alternatively, when the carbon nanotubes include the first carbon nanotubes, the first carbon nanotubes have a mass percentage of 5% or less in the fit; and when the carbon nanotubes include the second carbon nanotubes, the second carbon nanotubes have a mass percentage between 0.1% and 10% in the frit.

Alternatively, the predetermined temperature is a preheating temperature at which the glass cement is preheated.

In yet another aspect, the present disclosure further provides in embodiments an electronic device, including:

a first glass substrate;

a second glass substrate;

a functional layer formed between the first glass substrate and the second glass substrate; and a sealant made of the above-mentioned frit and arranged between the first glass substrate and the second glass substrate, wherein a hermetic area is formed between the first glass substrate and the second glass substrate by bonding the first glass substrate and the second glass substrate with the sealant, and the functional layer is located within the hermetic area.

The present disclosure has the following advantageous effects. According to embodiments of the present disclosure, the frit is added with carbon nanotubes, which have relative strong absorption to light, it may promote the glass cement to absorb more laser energy, so as to decrease the laser power desired for the sealing process, thereby to avoid a crack from occurring in the glass substrate. Moreover, according to embodiments of the present disclosure, the carbon nanotubes added into the frit may be of different degradation temperatures, wherein those carbon nanotubes having the degradation temperature lower than the predetermined temperature are degraded during the preheating treatment, which results in a plurality of voids distributed in an inorganic sealing glass precursor obtained after the preheating treatment, thereby to increase its internal porosity, as well as enhance scattering and absorption to photons; those carbon nanotubes having the degradation temperature higher than the predetermined temperature remain undegraded during the preheating treatment, which may promote the glass cement to absorb more laser energy due to its strong absorption to light, thereby to improve impermeability and reliability by increasing bond strength between the frit and the glass substrate.

DETAILED DESCRIPTION

In order to make the objects, the technical solution and the advantage of the present disclosure more apparent, detailed descriptions will be made hereinafter in conjunction with drawings and embodiments.

According to embodiments of the present disclosure, the carbon nanotubes which have relative strong absorption to light are added into the frit innovatively, i.e., the carbon nanotubes is utilized to promote the glass cement to absorb more laser energy, so that a laser source having relative low power may be used during the sealing process, thereby to avoid a crack from occurring in the glass substrate.

First of all, the fit according to embodiments of the present disclosure is illustrated. The present disclosure provides in embodiments frit, which includes sealing glass and a filler, wherein the filler includes carbon nanotubes. According to embodiments of the present disclosure, the frit is mixed with the carbon nanotubes, thereby to promote the frit to absorb more laser energy.

Specifically, the carbon nanotubes added into the frit may be first carbon nanotubes having a degradation temperature lower than a predetermined temperature; or may be second carbon nanotubes having a degradation temperature higher than the predetermined temperature. Certainly, the fit may also be added with the first carbon nanotubes and the second carbon nanotubes. Here, the predetermined temperature is a preheating temperature at which the glass cement is preheated when an electron device is sealed with the glass cement obtained by dispersing the frit into a carrier. The preheating treatment and a mass percentage of each kind of carbon nanotubes in the frit will be described hereinafter.

Figure 1:
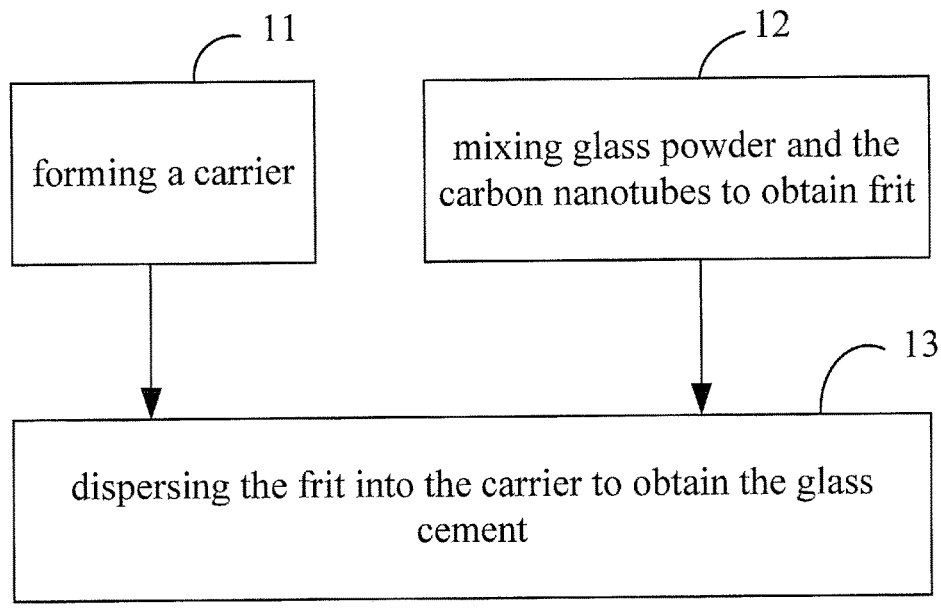
FIG. 1 is a flow chart of a method for manufacturing glass cement according to an embodiment of the present disclosure.

Next, the method for manufacturing the glass cement according to embodiments of the present disclosure will be described below. Referring to FIG. 1, according to embodiments of the present disclosure, the method for manufacturing the glass cement includes the following Step 11 to Step 13.

Step 11, forming a carrier. Here, the carrier may be obtained by dissolving a cellulosic material into an organic solvent selected in advance. To be specific, according to embodiments of the present disclosure, the carrier may be obtained by dissolving at least one kind of cellulose with a similar structure selected from methyl cellulose, carboxymethyl cellulose, propyl cellulose and nitrocellulose, into a solvent selected from terpineol, butyl carbitol acetate, and ethyl carbitol acetate.

Step 12, mixing sealing glass and the carbon nanotubes to obtain the fit. According to embodiments of the present disclosure, particles of the sealing glass obtained by grinding are mixed with the carbon nanotubes. According to embodiments of the present disclosure, the sealing glass being as a basic ingredient has a mass percentage between 70% and 90% in the frit, which is also an ingredient for forming glass network. In addition, the frit may further include some fillers which may be at least one oxide selected from $V_2O_5$, $ZrO$, $TeO$, $WO_3$, $TiO_2$, $P_2O_5$, $Al_2O_3$, $ZnO$, $SiO_2$, $B_2O_3$, $MgO$, $CaO$, $SrO$, $BaO$, $Li_2O$, $Na_2O$ and $K_2O$.

The above-mentioned filler may include an ingredient which can reduce thermal expansion coefficient and decrease a softening temperature, such as ZnO. Alternatively, the filler has a mass percentage between 1% and 20%. When the content of the filler is too high, the stability of the glass having a low melting point is decreased during moulding, easily resulting in devitrification, thereby failing to obtain the sealing glass. The monovalent metal ions mentioned in the above ingredients are used to increase reactivity of an interface between the substrate glass and the sealing glass, so as to improve bond strength. It is advisable that the content of the monovalent metal ions is within a range of tens to hundreds ppm.

Here, the carbon nanotubes mixed into the frit may include single wall carbon nanotubes and/or multiwall carbon nanotubes. The carbon nanotubes may include first carbon nanotubes having a degradation temperature lower than a predetermined temperature and second carbon nanotubes having a degradation temperature higher than the predetermined temperature. Of course, according to embodiments of the present disclosure, the frit may include only one kind of the first carbon nanotubes and the second carbon nanotubes. Here, the predetermined temperature refers to a preheating temperature at which the glass cement is preheated to remove a solvent and an organic component during sealing the glass substrates. The carbon nanotubes having different degradation temperatures in the glass cement may have different effects during subsequent steps of sealing glass substrates, which will be illustrated in details hereinafter.

According to embodiments of the present disclosure, considering different effects and properties of the carbon nanotubes having different degradation temperatures, for example, the first carbon nanotubes having a relative low degradation temperature is degraded after sintering, which results in a plurality of distributed within a film, and a poor mechanical strength. Hence it is required that the content of the first carbon nanotubes cannot be too high. Similarly, although the second carbon nanotubes having a relative high degradation temperature is capable of absorbing more laser energy, it cannot serve as a structural support. As a result, it is required that the content of the second carbon nanotubes cannot be too high either. According to an exemplary embodiment, when the carbon nanotubes include the first carbon nanotubes, the first carbon nanotubes have a mass percentage of 5% or less in the frit; and when the carbon nanotubes include the second carbon nanotubes, the second carbon nanotubes have a mass percentage between 0.1% and 10% in the frit.

The carbon nanotubes can be manufactured by a graphite arc method, a laser evaporation method, a catalytic pyrolysis method, a chemical vapor deposition method, a hydrothermal method and the like. A temperature for carbon nanotubes degradation may be determined depending on its manufacturing method, for example, the carbon nanotubes which still remain stable at a high temperature may be synthesized by the chemical vapor deposition (CVD) method, with a degradation temperature of 500° C. or more. The carbon nanotubes which are synthesized by a low temperature chemical method is degraded during sintering at a low temperature, with a degradation temperature of 300° C. or less. After being purified, the carbon nanotubes obtained by a chemical method is mixed with grinded particles of the sealing glass. According to an exemplary embodiment of the present disclosure, the carbon nanotubes having the degradation temperature of 200° C. to 300° C. and the carbon nanotubes having the degradation temperature of 500° C. or more are manufactured in advance, respectively, which are then mixed with the sealing glass.

Step 13, dispersing the frit into a carrier to obtain the glass cement. In Step 13, the glass cement having a certain viscosity may be obtained by dispersing mixed materials into the carrier. According to embodiments of the present disclosure, the frit includes the sealing glass and a filler. The filler includes the carbon nanotubes. Specially, the carbon nanotubes may include first carbon nanotubes having a degradation temperature lower than a predetermined temperature and second carbon nanotubes having a degradation temperature higher than the predetermined temperature. Of course, the fit may include only one kind of the first carbon nanotubes and the second carbon nanotubes. To be specific, the predetermined temperature refers to a preheating temperature at which the glass cement is preheated when an electron device is sealed with the glass cement. The glass cement is obtained by dispersing the frit into the carrier.

According to an exemplary embodiment of the present disclosure, when the carbon nanotubes include the first carbon nanotubes, the first carbon nanotubes have a mass percentage of 5% or less in the frit; and when the carbon nanotubes include the second carbon nanotubes, the second carbon nanotubes have a mass percentage between 0.1% and 10% in the frit.

Figure 2:
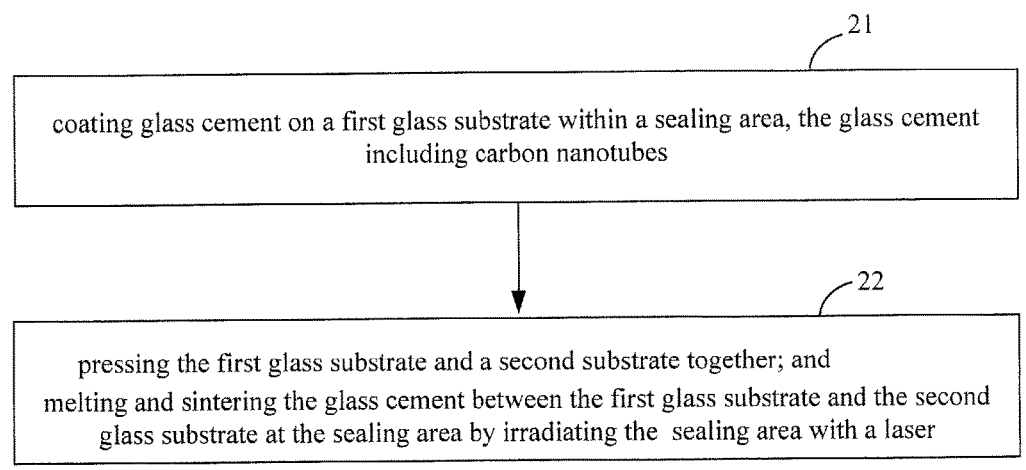
FIG. 2 is a flow chart of a substrate-sealing method according to an embodiment of the present disclosure.

After the glass cement is obtained in Step 13, the present disclosure further provides in embodiments a step of performing frit sealing with obtained glass cement. Thus the present disclosure further provides in embodiments a substrate-sealing method, as shown in FIG. 2, the method includes Step 21 and Step 22.

Step 21, coating the above-mentioned glass cement on a first glass substrate within a sealing area, the glass cement including the carbon nanotubes. Here, the glass cement is coated within an area adjacent to periphery of the first glass substrate, so as to constitute a bar-like glass sealing area (eg. a sealant) and form a predetermined pattern by glue dispensing, silk-screen printing, or the like. Certainly, according to some other embodiments of the present disclosure, the glass cement may also be coated within the sealing area by other methods such as coating.

Step 22, pressing the first glass substrate and a second glass substrate together, melting and sintering the glass cement between the first glass substrate and the second glass substrate at the sealing area by irradiating the sealing area with a laser. Here, a hermetic sealing may be formed after the first glass substrate and the second glass substrate are bonded to each other by melting and sintering the glass cement therebetween within the sealing area with a movable laser, so as to seal the first glass substrate and the second glass substrate. When the carbon nanotubes comprise the second carbon nanotubes and the glass cement coated within the sealing area is irradiated with the laser, transmitting power of the laser is controlled to enable the sealing area to be at a temperature lower than the degradation temperature of the second carbon nanotubes.

A central wavelength of the laser is between 705 nm and 2000 nm in a range of infrared wavelength. Alternatively, according to embodiments of the present disclosure, the carbon nanotubes are selected in accordance with the central wavelength of the used laser, so that the selected carbon nanotubes may have an excellent absorption to the laser with the central wavelength, thereby to promote the absorption to laser energy.

After Step 22, a direct contacting surface between the first glass substrate and the second glass substrate may be formed via bonding effect within the bar-like glass sealing area by irradiating the sealing area with a laser, so as to bond the first glass substrate and the second glass substrate, thereby to form the hermetic region for protecting sensitive electronic components (such as an organic light emitting diode, a solar cell and other optoelectronic devices).

Figure 3:
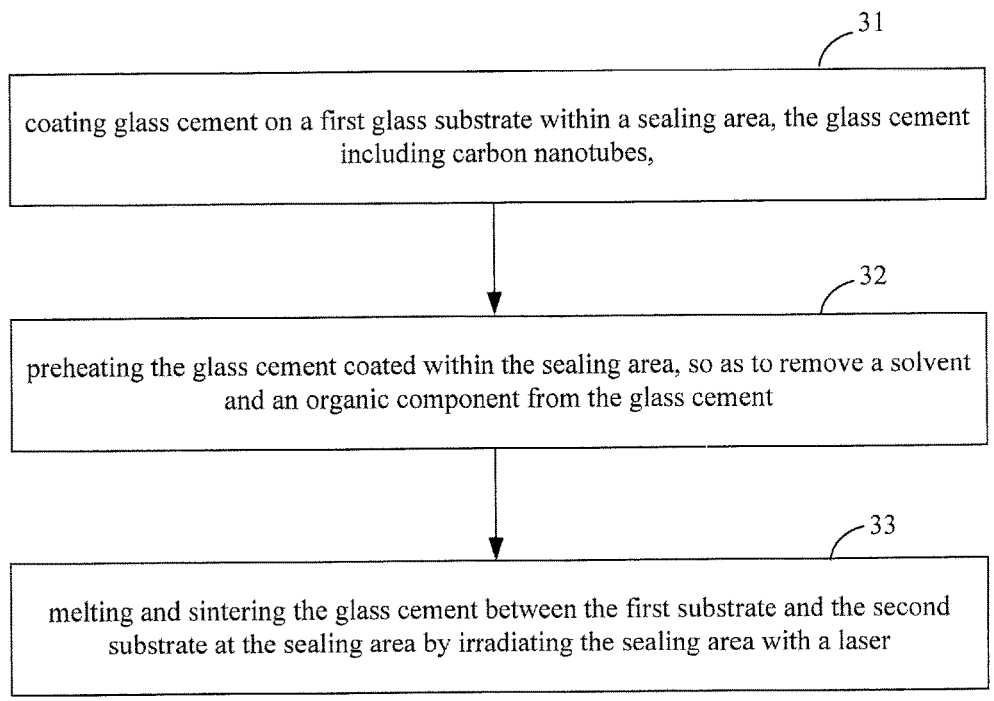
FIG. 3 is a flow chart of a substrate-sealing method according to another embodiment of the present disclosure.

As shown in FIG. 3, the present disclosure further provides in embodiments a substrate-sealing method, including the following steps:

Step 31, coating the above-mentioned glass cement on a first glass substrate within a sealing area, the glass cement including carbon nanotubes;

Step 32, preheating the glass cement coated within the sealing area, so as to remove a solvent and an organic component from the glass cement; and Step 33, pressing the first glass substrate and a second glass substrate together, and melting and sintering the glass cement between the first glass substrate and the second glass substrate at the sealing area by irradiating the sealing area with a laser.

Above Steps 31 and 33 are similar to Steps 21 and 22 in FIG. 2, respectively. In addition, in this embodiment, the glass cement coated within the sealing area is further preheated between Steps 31 and 33. Here, in Step 32, the glass cement formed in Step 31 is preheated, so as to remove the solvent and the organic component from the glass cement and form an inorganic sealing glass precursor preliminary. When the carbon nanotubes include the first carbon nanotubes, the first carbon nanotubes having the degradation temperature lower than the predetermined temperature are degraded during the preheating treatment, which results in a plurality of voids distributed in the inorganic sealing glass precursor, thereby to enhance scattering and absorption to photons and improve absorption efficiency to light.

The above process of manufacturing glass cement which includes the carbon nanotubes has the following advantages:

1) The first carbon nanotubes having the degradation temperature lower than the predetermined temperature are degraded during sintering, which results in a plurality of voids distributed inside the formed firm and being of a diameter at nanoscale. Then when the film is irradiated by the laser, photons entering the film with the voids are difficult to exit due to continuous refraction and scattering, thereby to promote the film to absorb more photons, improve absorption efficiency to the laser energy and optimize sealing effect. In order to ensure the mechanical strength of the film, alternatively, the first carbon nanotubes have a mass percentage of 5% or less in the frit.

2) The second carbon nanotubes having the degradation temperature higher than the predetermined temperature remain undegraded during sintering at a high temperature. As the undegraded second carbon nanotubess are of strong absorption to light, it may also promote the film to absorb the laser energy, so as to greatly reduce desired power of laser source. The second carbon nanotubes are required to be of a certain content for sufficient melt of the glass cement. At the same time, if the content of the second carbon nanotubes is too high, irradiating with the laser may lead to a crack occurring in the second glass substrate due to local heat near to the interface of the first glass substrate and the second glass substrate, or may lead to decreased mobility of a sealing glass material during melting, thus the content of the second carbon nanotubes is required to be controlled properly. According to embodiments of the present disclosure, the second carbon nanotubes have a mass percentage between 0.1% and 10% in the frit.

Figure 4:
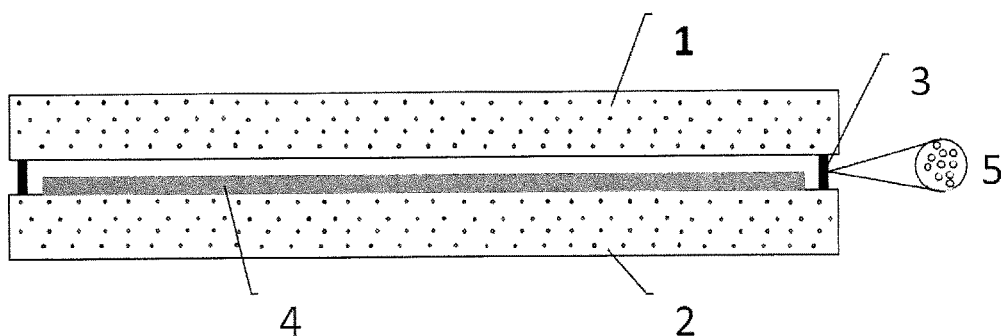
FIG. 4 is a schematic view showing an electronic device according to an embodiment of the present disclosure.

The present disclosure further provides in embodiments an electron device. The electron device may be a variety of display devices, such as a liquid crystal display, an organic light emitting diode (OLED) device, and the like. The electron device may also be an organic photovoltaic solar cell, etc. The electron device may be manufactured by the methods according to the above embodiments. As shown in FIG. 4, the electron device includes:

a first glass substrate 1,
a second glass substrate 2,
a functional layer 4 formed between the first glass substrate and the second glass substrate, wherein the a function layer 4 may be a variety of sensitive electronic components, such as an organic light emitting diode, a solar cell and other optoelectronic device; and
a sealant 3 made of the frit according to the above embodiments of the present disclosure and arranged between the first glass substrate 1 and the second glass substrate 2,
wherein a hermetic area is formed between the first glass substrate 1 and the second glass substrate 2 by bonding the first glass substrate 1 and the second glass substrate 2 with the sealant 3, and the functional layer 4 is located within the hermetic area.

In summary, according to embodiments of the present disclosure, the existing glass cement is improved by doping with the carbon nanotubes, thereby to enhance the absorption efficiency of the glass cement to laser. In addition, the frit according to embodiments of the present disclosure is used for sealing glass substrates, by which the laser power desired for the sealing process is decreased, thereby to avoid a crack from occurring in the glass substrate caused by irradiating the sealing area with the laser source having high power.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A substrate-sealing method, comprising steps of:
coating glass cement on a first glass substrate within a sealing area, the glass cement including sealing glass and carbon nanotubes that comprise first carbon nanotubes and second carbon nanotubes;
preheating the glass cement coated within the sealing area, so as to remove a solvent and an organic component from the glass cement at a preheating temperature which is higher than the degradation temperature of the first carbon nanotubes such that the degradation of the first carbon nanotubes will result in a plurality of voids distributed in the sealing glass after the preheating treatment;
pressing the first glass substrate and a second glass substrate together; and
melting and sintering the glass cement between the first glass substrate and the second glass substrate at the sealing area by irradiating the sealing area with a laser, wherein the second carbon nanotubes have a degradation temperature higher than the preheating temperature.

2. The method according to claim 1, wherein the glass cement is formed by the following steps:
mixing sealing glass and the carbon nanotubes to obtain frit; and
dispersing the frit into a carrier to obtain the glass cement.

3. The method according to claim 1, wherein
the first carbon nanotubes have a mass percentage of 5% or less in the frit; and
the second carbon nanotubes have a mass percentage between 0.1% and 10% in the frit.

4. The method according to claim 1, wherein when the carbon nanotubes comprise the second carbon nanotubes and the glass cement coated within the sealing area is irradiated with the laser, and transmitting power of the laser is controlled to enable the sealing area to be at a temperature lower than the degradation temperature of the second carbon nanotubes.

5. The method according to claim 1, wherein the first carbon nanotubes has a mass percentage of 5% or less in the frit.

6. Frit, comprising sealing glass and a filler, wherein the filler comprises first carbon nanotubes having a degradation temperature of 300° C. or less and second carbon nanotubes having a degradation temperature of 500° C. or more.

7. The frit according to claim 6, wherein
the first carbon nanotubes have a mass percentage of 5% or less in the frit; and
the second carbon nanotubes have a mass percentage between 0.1% and 10% in the frit.

8. An electronic device, comprising:
a first glass substrate,
a second glass substrate,
a functional layer formed between the first glass substrate and the second glass substrate, and
a sealant made of the frit according to claim 6 and arranged between the first glass substrate and the second glass substrate,
wherein a hermetic area is formed between the first glass substrate and the second glass substrate by bonding the first glass substrate and the second glass substrate with the sealant, and the functional layer is located within the hermetic area.

\* \* \* \* \*